United States Patent
Klatt et al.

[11] Patent Number: 6,069,795
[45] Date of Patent: May 30, 2000

[54] PCMCIA CARD FOR RECEIVING AND CONTACTING A CHIP CARD

[75] Inventors: Dieter Klatt, Wülfrath; Bernhard Pelke, Wuppertal, both of Germany

[73] Assignee: Stocko Metallwarenfabriken, Germany

[21] Appl. No.: 08/953,022

[22] Filed: Oct. 17, 1997

Related U.S. Application Data

[63] Continuation of application No. 08/624,964, Mar. 29, 1996, abandoned.

[30] Foreign Application Priority Data

Apr. 1, 1995 [DE] Germany .................. 295 05 678 U

[51] Int. Cl.[7] .................................................. H05K 1/14
[52] U.S. Cl. .......................... 361/737; 361/728; 361/752; 257/679; 235/492; 439/946
[58] Field of Search .................................... 361/737, 752, 361/683–686, 724–727; 257/679; 439/946, 76.1, 260; 235/380, 492, 441

[56] References Cited

U.S. PATENT DOCUMENTS

| | | |
|---|---|---|
| 5,015,830 | 5/1991 | Masuzawa et al. . |
| 5,457,601 | 10/1995 | Georgopulos et al. .................. 361/686 |
| 5,473,505 | 12/1995 | Kessoku et al. . |
| 5,519,571 | 5/1996 | Shieh ...................................... 361/685 |
| 5,532,466 | 7/1996 | Konno et al. ........................... 235/441 |

FOREIGN PATENT DOCUMENTS

| | | |
|---|---|---|
| 0214478 | 3/1987 | European Pat. Off. . |
| 0433688 | 6/1991 | European Pat. Off. . |
| 0552078 | 7/1993 | European Pat. Off. . |
| 0609974 | 8/1994 | European Pat. Off. . |
| 0635801 | 1/1995 | European Pat. Off. . |
| 2578072 | 8/1986 | France . |
| 3528558 | 2/1987 | Germany . |
| 9012889 | 1/1991 | Germany . |
| 4310517 | 10/1994 | Germany . |
| WO 91/00681 | 1/1991 | WIPO ..................................... 361/684 |

*Primary Examiner*—Leo P. Picard
*Assistant Examiner*—Jayprakash N. Gandhi
*Attorney, Agent, or Firm*—Robert W. Becker & Associates

[57] ABSTRACT

A contacting unit for a card with electronic components has a base plate with an array of contacts arranged at one edge of the base plate. A cover plate is connected to the base plate at least in the area of the edge and in the area of corners of the base plate remote from the edge. The cover plate is congruent to and positioned parallel to the base plate. A printed circuit board is connected to the base plate so as to extend parallel thereto between the base plate and the cover plate. The printed circuit board and the cover plate delimit therebetween a receiving slot for a card with electronic components. The printed circuit board has a first set of contacting elements for contacting the electronic components of the card.

13 Claims, 3 Drawing Sheets

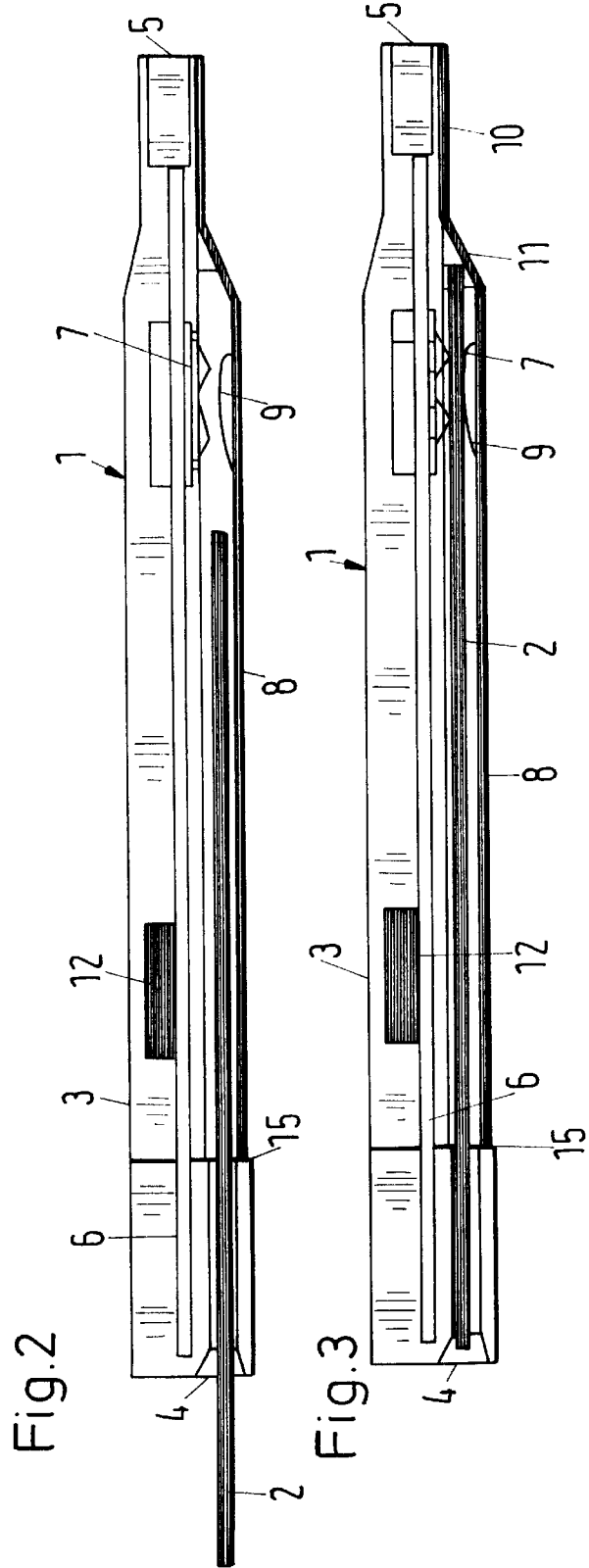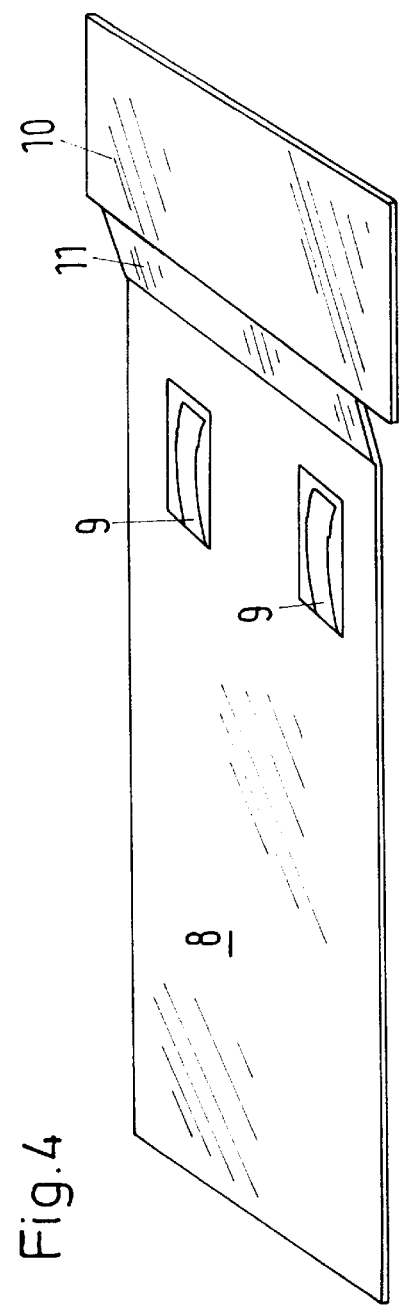
Fig.2
Fig.3
Fig.4

PCMCIA CARD FOR RECEIVING AND CONTACTING A CHIP CARD

This application is a continuation, of application Ser. No. 08/624,964 filed Mar. 29, 1996, now abandoned.

BACKGROUND OF THE INVENTION

The present invention relates to a contacting unit for card-shaped support elements with electronic components. The contacting unit comprises a base plate with a size suitable for a plane-parallel receiving slot for a card-shaped support element, at least one printed circuit board, which is substantially parallel to the base plate and has at its surface contacting elements for the electronic components of the support element. One edge of the base plate has connected thereto an array of contacts.

Especially in the field of computer technology electronic components are preferably arranged on card-shaped support elements. Such support elements have contacting areas and are insertable into contacting units where they are electrically contacted and integrated into the data circuit. Card-shaped support elements according to the so-called PCMCIA standard are known. These support elements are cards that have a standardized matrix contacting area and can receive various IC circuits. Such cards may be memory expansion cards, disc drive cards, modem cards etc. They can be contacted in a contacting unit with a corresponding pin matrix when inserted into the insertion slot of the computer. So-called chip card are known which are, for example, used as telephone cards and for similar applications. They are provided with a really positioned contacting areas for contacting a chip and are also to be inserted into contacting units that are especially embodied as reading units. In the recent past a combination of card systems has been used whereby, for example, simultaneously a PCMCIA card and a chip card are inserted into corresponding contacting unit.

With respect to the combination of card systems it is known from European Application 0 552 078 A1 to provide a PCMCIA card with a recess for a chip card. The recess is positioned remote from the contacting area. At the exposed surface of the recess a field of contacting elements for the electronic components of the chip card is arranged. This development requires the invention of both cards on top one another through the insertion slot, for example, of a computer in the area of the contacting area or to exchange the chip card while the PCMCIA card remains inserted. In this context it is disadvantageous that the contacting area is exposed, that the chip card is only minimally guided and furthermore movable even in the operating position relative to the PCMCIA card so that a secure contacting is not ensured.

The German Offenlegungsschrift 43 10 513 suggests to enlarge at a PCMCIA card (known from European Patent Application 0 552 078 A1) the area opposite the contacting area, which in the operating position of the PCMCIA card by definition must project from the housing, such that a guide slot for a chip card is formed. This suggestion however deviates from the standardized design of PCMCIA cards and cannot prevent the chip card from being pivoted out of the guide plane. Insofar as inner guide plates are suggested, the chip card upon insertion abuts at the plate elements. A secure operation with respect to multiple actuations of vending machines etc. can thus not be ensured with the known devices.

Other suggestions are known according to which the housing of the PCMCIA card is at least of a two-part construction in order to embody with a responding sizing of the individual parts a guide channel or guide channels. This design can only be manufactured with great monetary expenditure and is not suitable for inexpensive mass production in regard to a wide-spread use of known card systems.

It is therefore an object of the present invention to provide a contacting unit of the aforementioned kind that can be manufactured with minimal expenditure and can be handled in a simple and reliable manner whereby for a correct usage a safe contacting with a card-shaped support element is ensured.

SUMMARY OF THE INVENTION

A contacting unit for a card with electronic components according to the present invention is primarily characterized by:

a base plate comprising an array of contacts arranged at an edge of the base plate;

a cover plate connected to the base plate at least in area of the edge and in an area of corners of the base plate remote from the edge;

the cover plate being congruent to and positioned parallel to the base plate;

a printed circuit board connected to the base plate so as to extend parallel thereto between the base plate and the cover plate;

the printed circuit board and the cover plate delimiting therebetween a receiving slot for a card with electronic components; and the printed circuit board having a first set of contacting elements contacting the electronic components of the card.

Advantageously, opposite the edge of the base plate an insertion slot is provided between the base plate and the cover plate.

Preferably, the base plate and the cover plate are detachably connected to one another.

Preferably, the cover plate is comprised of segments. In another embodiment of the present invention, the cover plate consists of metal or plastic material.

Preferably, the cover plate in the area of the edge has a slanted portion.

The printed circuit board preferably has at least a second set of contact elements.

In a further embodiment of the present invention the contacting unit comprises a recess for receiving a plug-in card.

Advantageously, the cover plate comprises at least one elastic element facing the printed circuit board.

Preferably, the at least one elastic element is a spring element.

Preferably, the at least one elastic element is adapted for electrical contacting.

In another embodiment of the present invention the contacting unit comprises at least one securing element.

According to the present invention, a cover plate is provided which is substantially congruent to the base plate, is plate-shaped and forms with the printed circuit board a slot-shaped receiving channel. The cover plate is connected to the base plate at least in the area of the array of contacts at the edge of the base plate and in the area of the corners arranged oppositely to the edge.

The contacting unit is comprised of simple components which each can be manufactured inexpensively. A base plate, for example, with the standardized PCMCIA card dimensions with respect to length and width, receives at least one printed circuit board and an array of contacts. The array of contacts is arranged in the area of the edge of the base plate. This is generally the rearward edge of the base plate when viewed in the direction of insertion. The printed circuit board has a field of contacting elements which are arranged at one surface area which is expediently the surface area facing away from the base plate. The printed circuit board extends plane-parallel within or on the base plate and is fixed in this position to the base plate. A plate-shaped cover element (cover plate) which has substantially the dimensions of the base plate is fastened to the base plate in the area of the edge at which the array of contacts of the base plate is arranged, i.e., for example, at the array of contacts, and at least in the area of the corners opposite the edge, i.e., the leading corners of the base plate in the direction of insertion. Thus, an insertion channel for chip cards results. They can be inserted between the cover plate and the printed circuit board. Simultaneously, the chip card is laterally guided because the base plate and the cover plate in the area of the loading corners are connected to one another.

The contact elements arranged on the printed circuit board are thus protected during transport of the contacting unit and also in operation, for example, against dust collection. The chip card can only be inserted in a defined manner and is guided laterally as well as in the plane of the card and is thus securely contacted. The individual components for producing the contacting unit can thus be manufactured in a simple and inexpensive manner.

According to an advantageous suggestion of the invention, between the base plate and the cover element (cover plate) an insertion slot is arranged in the area of the edge opposite the array of contacts. Due to this measure, a safe insertion of the chip card is ensured. In an advantageous manner the connection of the individual components is detachable. Due to this measure, the modular contacting unit can be easily redesigned or serviced. A further favorable aspect is that the cover element according to another advantageous suggestion of the invention is comprised of segments. The cover element may be plate-shaped element consisting of metal or plastic material.

According to another suggestion of the invention, the cover plate in the area where it is connected to the array of contacts is provided with a slanted portion. This slanted portion extends substantially parallel to the rearward edge and thus forms a slant in the rearward area with which a chip card inserted into the contacting unit is forced away from the cover plate toward the printed circuit board and thus against the contact elements. The contacting reliability is thus considerably increased.

According to a further embodiment of the invention, the printed circuit board is provided with a second set of contacting elements for a second support element (card). In an especially advantageous manner, in the area of the second set of contacting elements a recess for a plug-in card is provided. Due to this measure, two chip cards of same or different sizes can be simultaneously used within the contacting unit which is itself of a card-shaped design and insertable into the insertion slot of data processing machines. This increases the operational safety of the system because the use of one card can be made dependent of the use of another card.

According to another advantageous suggestion the cover element (cover plate) is provided with elastic elements at one of its surface areas. These elastic elements are positioned opposite the contacting elements provided at the printed circuit board. Due to this measure, a chip card inserted into the contacting unit is forced more strongly toward the set of contacting elements. It is especially advantageous to embody the elastic elements, for example, spring elements, as electric contacting elements. Furthermore, the elastic elements can be in the form of securing elements. When a spring element is in the form of an electric contacting element, it is also possible to detect the presence of a chip card to be evaluated. When the spring element is used as a securing element, it may cooperated with recesses provided at the card so that it functions as a code lock.

BRIEF DESCRIPTION OF THE DRAWINGS

The object and advantageous of the present invention will appear more clearly from the following specification in conjunction with the accompanying drawing, in which:

FIG. 2 is a schematic cross-sectional view of the embodiment of FIG. 1 in a first position;

FIG. 3 is a schematic cross-sectional view of the embodiment of FIG. 1 in a second position;

FIG. 4 shows a perspective representation of a cover plate; and

DESCRIPTION OF THE PREFERRED EMBODIMENTS

Figure 1:
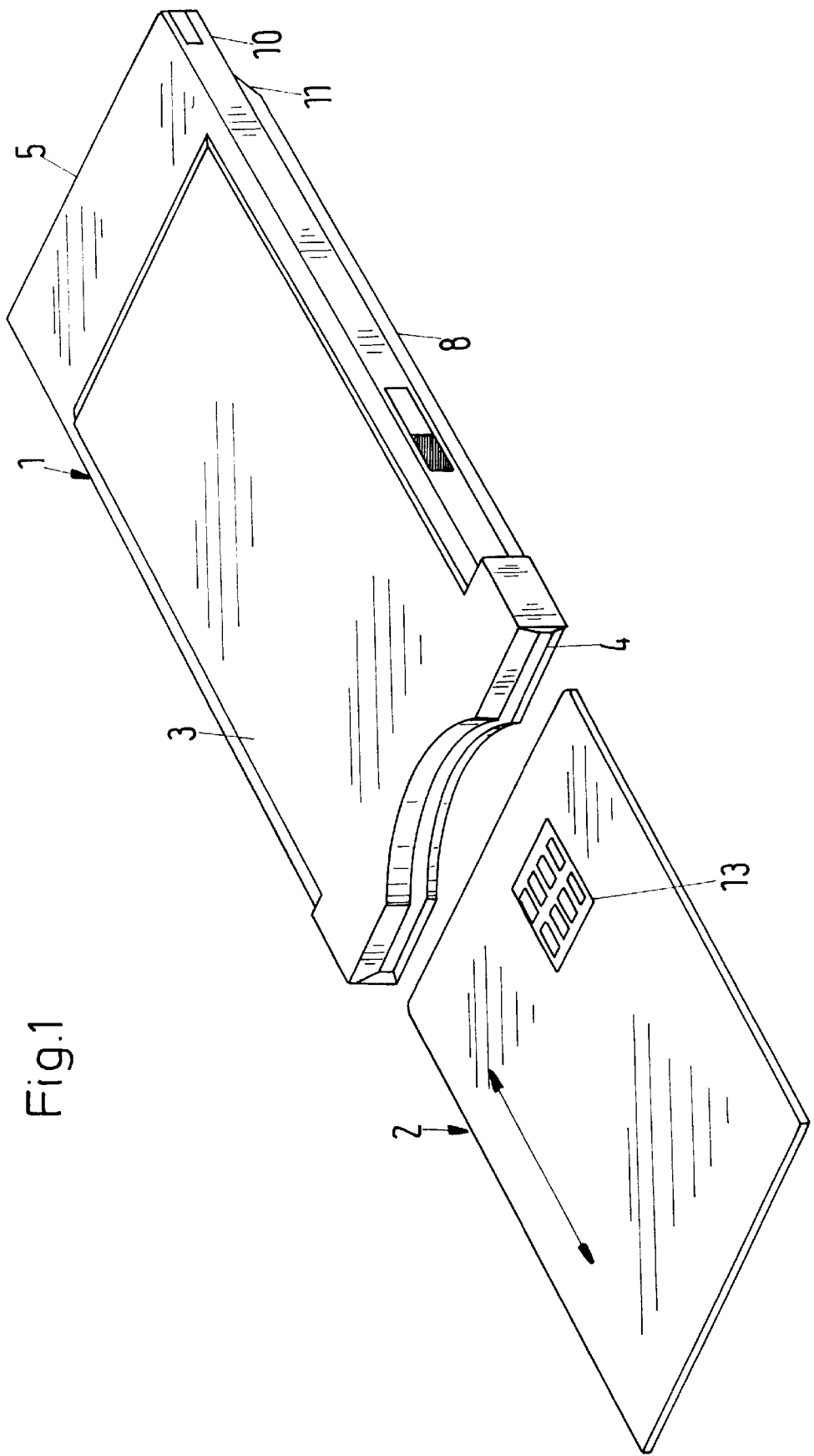
FIG. 1 is a perspective representation of one embodiment of the present invention.

The present invention will now be described in detail with the aid of several specific embodiments utilizing FIGS. 1 through 5.

With respect to the embodiment represented in FIGS. 1 to 3, the invention will be explained in the following in more detail. A contacting unit, in the shown embodiment a PCMCIA card 1, serves for contacting a chip card 2 on which a chip array 13 is arranged. It comprises a base plate 3 which at its leading edge comprises an insertion slot 4 and which, in the direction of insertion, at its rearward end is provided with an array of contacts 5. The chip card 2 can be inserted and removed in the direction of the shown double arrow into the PCMCIA card 1. In the shown embodiment the insertion slot 4 is shown as an element which is a unitary part of the base plate 3. This insertion slot 4 is optional and must not be in the form of an integral component. In the interior of the PCMCIA card a printed circuit board 6 connected to the array of contacts 5 is positioned plane-parallel to the base plate 3 and comprises a set of contacting elements 7 for contacting the chip field 13. Thus, the chip card 2 can be processed with the aid of the PCMCIA card, when the latter is inserted in the insertion slot of an electronic computing device, via the array of contacts 5 and corresponding contacts of the computing device. Such a device can be used in the field of communication, banking etc.

A cover plate 8 is arranged plane-parallel to the base plate 3 and forms an insertion channel for the chip card 2 together with the printed circuit board 6. The cover plate 8 is connected in the area of the array of contacts 5 and in the area of the oppositely arranged corners, in the shown embodiment at the fastening zone 15, to the base plate 3.

As shown in FIG. 4, the cover plate 8 comprises spring elements 9 which are arranged at the surface area of the cover plate 8 and are positioned substantially opposite the contacting elements 7 of the printed circuit board 6. This ensures that the chip card is pressed against the contacting elements 7. Furthermore, the cover plate 8 in the area of the array of contacts 5 comprises a fastening plate 10 for fastening the cover plate 8 to the base plate 3 and a slanted portion 11 so that an upward slant for the chip card to be inserted is provided. This slant forces the card additionally toward the contacting elements 7 when, as shown in FIG. 3, it is fully inserted.

Figure 5:
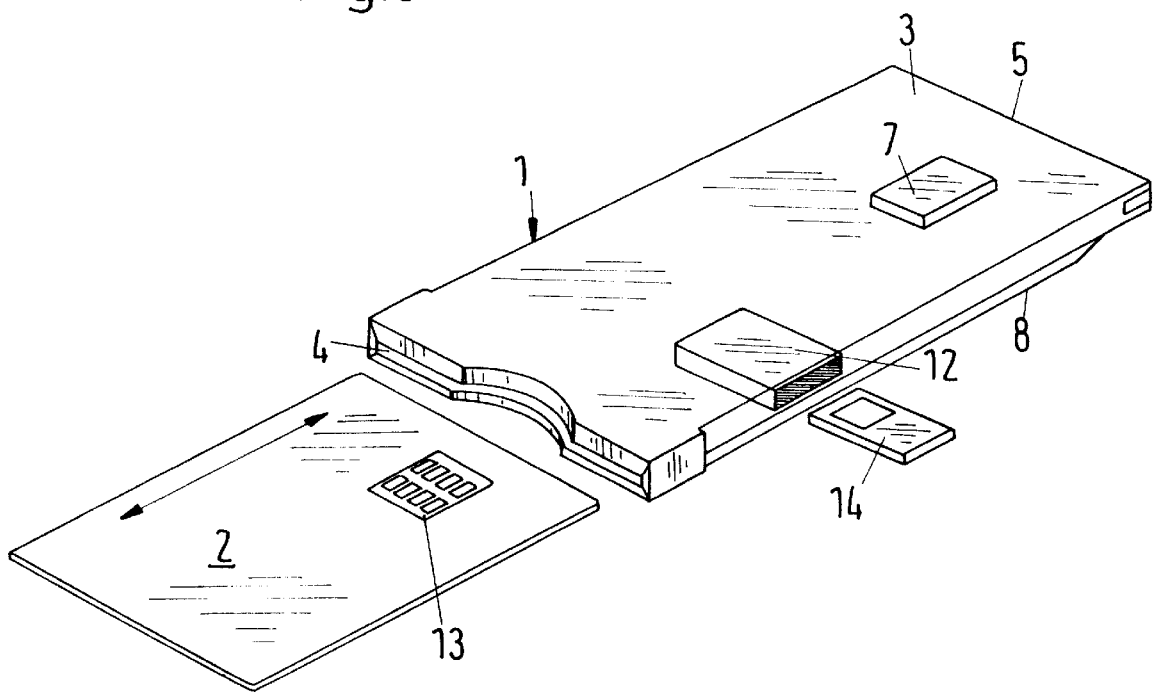
FIG. 5 is a perspective presentation of a further embodiment.

In the embodiment represented in FIG. 5, which corresponds substantially to the embodiment of FIG. 1, a second insertion option in the form of a slot 12 for a so-called plug-in card 14 is provided. Thus, it is possible to insert simultaneously two chip cards into the contacting unit in the shown embodiment in the form of the PCMCIA card 1.

There is a wide ranging field of application for the inventive device. For example, one of the chip cards may be an authorization card while the other, for example, is an account card for withdrawing certain monetary amounts. The contacting device can be used in various apparatus such as parking meters, trucks, buses, T.V. sets, etc., in order to make payment for services.

The present invention is, of course, in no way restricted to the specific disclosure of the specification and drawings, but also encompasses any modifications within the scope of the appended claims.

What we claim is:

1. A PCMCIA card for insertion into an electronic computing device and for receiving and contacting a chip card with electronic components, said PCMCIA card comprising:

a base plate comprising a PCMCIA contact pad, for contacting an electronic computing device when inserted into the electronic computing device, arranged at an edge of said base plate;

a cover plate connected to said base plate at least in an area of said edge and in an area of corners of said base plate remote from said edge;

said cover plate being congruent to and positioned parallel to said base plate, wherein said base plate and said cover plate connected to one another have outer dimensions meeting the PCMCIA standard;

a printed circuit board connected to said base plate so as to extend parallel thereto between said base plate and said cover plate;

a receiving slot for receiving a chip card with electronic components, wherein said receiving slot is defined by a face of said printed circuit board facing said cover plate and a face of said cover plate facing said printed circuit board; and said printed circuit board having a first set of contacting elements, arranged at a face facing said cover plate, for contacting the electronic components of an inserted chip card.

2. A contacting unit according to claim 1, wherein opposite said edge of said base plate an insertion slot is provided between said base plate and said cover plate.

3. A contacting unit according to claim 1, wherein said base plate and said cover plate are detachably connected to one another.

4. A contacting unit according to claim 1, wherein said cover plate is comprised of segments.

5. A contacting unit according to claim 1, wherein said cover plate consists of metal.

6. A contacting unit according to claim 1, wherein said cover plate consists of plastic material.

7. A contacting unit according to claim 1, wherein said cover plate in the area of said edge has a slanted portion.

8. A contacting unit according to claim 1, wherein said printed circuit board has at least one second set of contacting elements.

9. A contacting unit according to claim 1 comprising a recess for receiving a plug-in card.

10. A contacting unit according to claim 1, wherein said cover plate comprises at least one elastic element facing said printed circuit board.

11. A contacting unit according to claim 10, wherein said at least one elastic element is a spring element.

12. A contacting unit according to claim 10, wherein said at least one elastic element is adapted for electrical contacting.

13. A contacting unit according to claim 1 comprising at least one securing element.

\* \* \* \* \*

UNITED STATES PATENT AND TRADEMARK OFFICE
CERTIFICATE OF CORRECTION

PATENT NO : 6,069,795
DATED : May 30, 2000
INVENTOR(S): Dieter Klatt and Bernhard Pelke It is certified that error appears in the above-identified patent and that said Letters Patent are hereby corrected as shown below:

On the Title Page, the following item(s) should read as follows:

[73] Assignee:

Stocko Metallwarenfabriken Henkels & Sohn GmbH & Co.

[22] Filed:

Oct. 16, 1997

Signed and Sealed this

Twenty-second Day of May, 2001

Attest:

NICHOLAS P. GODICI

Attesting Officer

Acting Director of the United States Patent and Trademark Office